United States Patent [19]

Masuda

[11] Patent Number: 5,005,154

[45] Date of Patent: Apr. 2, 1991

[54] HIGH SPEED PROGRAMMABLE READ ON MEMORY DEVICE FORMED BY BIPOLAR TRANSISTORS

[75] Inventor: Hajime Masuda, Tokyo, Japan

[73] Assignee: NEC Corporation, Tokyo, Japan

[21] Appl. No.: 381,902

[22] Filed: Jul. 19, 1989

[30] Foreign Application Priority Data

Jul. 19, 1988 [JP] Japan .................................. 63-181025

[51] Int. Cl.⁵ .............................................. G11C 11/34
[52] U.S. Cl. .................. 365/96; 365/230.03; 365/230.06
[58] Field of Search .................. 365/96, 104, 203, 204, 365/230.06, 189.05, 230.03

[56] References Cited

U.S. PATENT DOCUMENTS

4,656,606 4/1987 Ohno et al. ............................ 365/104

*Primary Examiner*—Joseph A. Popek
*Attorney, Agent, or Firm*—Sughrue, Mion, Zinn, Macpeak & Seas

[57] ABSTRACT

A programmable read only memory device according to the present invention comprises a plurality of row selector blocks respectively coupled between row lines and a ground node, and each row selector block has a first discharging unit providing a current path in a read-out mode of operation only and a second discharging unit providing a current path in both write-in and read out modes of operation, so that the current driving capability is decreased in the read out mode of operation, thereby decreasing the current consumption as well as the time period consumed for a single read out operation.

16 Claims, 5 Drawing Sheets

HIGH SPEED PROGRAMMABLE READ ON MEMORY DEVICE FORMED BY BIPOLAR TRANSISTORS

FIELD OF THE INVENTION

This invention relates to a programmable read only memory device formed by bipolar transistors and, more particularly, to an addressing facility for a high speed read-out operation.

DESCRIPTION OF THE RELATED ART

Figure 1A:
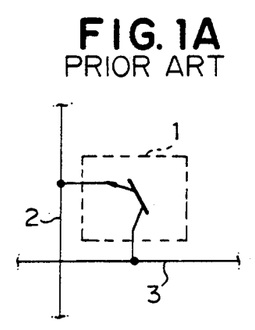
FIGS. 1A to 1C are circuit diagram showing memory cells formed by bipolar transistors.
Figure 1B:
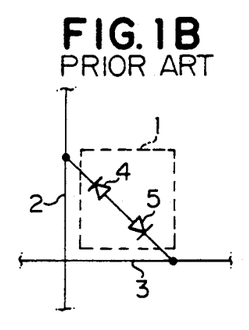
Figure 1C:
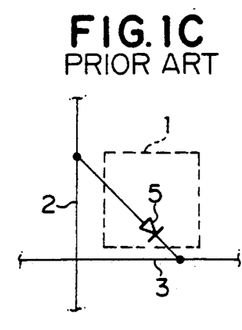

The programmable read only memory device provides a data storage where a user can fixedly memorize his data after the fabrication of the memory device, and is applied to the data storage in various processing system as well as controlling units. A typical example of the memory cell incorporated in the programmable read only memory is shown in FIG. 1A and is formed by a single bipolar transistor 1 coupled at the emitter node thereof to a column line 2 and at the collector node thereof to a row line 3. The memory cell thus formed by the bipolar transistor is equivalent to two diodes 4 and 5 coupled in a back to back fashion as shown in FIG. 1B, and the two diodes are formed by an emitter-base junction and a base-collector junction, respectively. If a large amount of current is applied to the column line 2, the emitter-base junction is permanently broken down, and, for this reason, the memory cell is represented by the single diode 5 (or the base-collector junction) as shown in FIG. 1C. The memory cell equivalent to the two diodes 4 and 5 blocks a small amount of current, however, the memory cell shown in FIG. 1C passes the current from the column line 2 to the row line 3, so that the two states are representative of logic "1" and "0" levels, respectively. Thus, the memory cell can be established into either state shown in FIG. 1B or 1C, so that the user writes a data bit by selective application of the large amount of current.

Figure 2A:
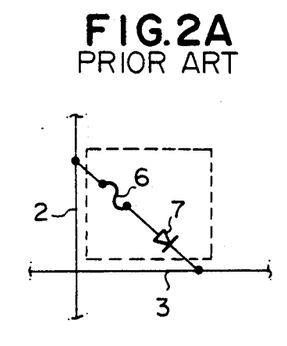
FIGS. 2A and 2B are circuit diagrams showing memory cells of another type formed by a series combination of a fuse element and a diode.
Figure 2B:
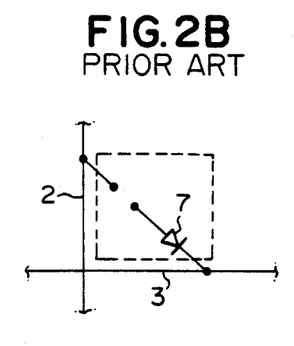

The memory cell is further formed by using a series combination of a fuse element 6 and a diode 7 coupled between the column line 2 and the row line 3 as shown in FIG. 2A. If a large amount of current is applied to the column line 2, the fuse element is thermally melted away as shown in FIG. 2B, and, for this reason, any small amount of current can not pass through the memory cell. The memory cells shown in FIGS. 2A and 2B respectively correspond to two logic states, so that the user also writes a data bit thereinto by selective application of a large amount of current.

Figure 3:
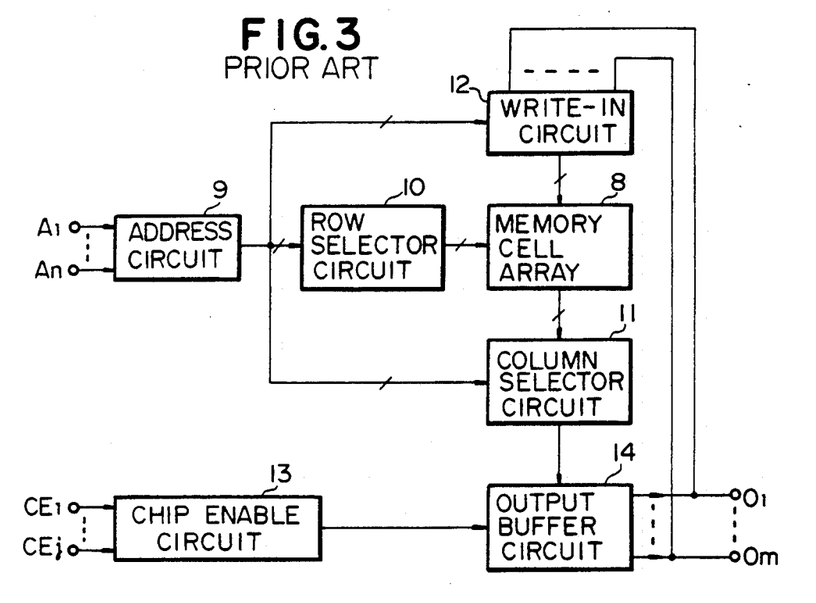
FIG. 3 is a block diagram showing the circuit arrangement of a prior art programmable read only memory device.

The programmable read only memory cells thus writable by the user are associated with peripheral circuits as shown in FIG. 3. In FIG. 3, reference numeral 8 designates a memory cell array formed by memory cells of either type shown in FIGS. 1A to 1C or FIGS. 2A and 2B. A multiple-bit address signal A1 to An is supplied to an address circuit 9 which distributes the multiple-bit address signal and the complementary signal thereof to a row selector circuit 10 and a column selector circuit 11. The row selector circuit 10 is coupled to a plurality of row lines each corresponding to the row line 3 of FIGS. 1A to 1C, and the column selector circuit 11 is coupled to a plurality of column lines each corresponding to the column line 2 of FIGS. 1A to 1C. The address circuit 9 is further operable to activate a write-in circuit 12 for providing a current path from output pins O1 to Om to one of the column of the memory cells in a write-in mode of operation. A chip enable circuit 13 is responsive to a chip enable signal CE1 to CEj, and is operative to inactivate an output buffer circuit 14 in the write-in mode of operation.

Figure 4:
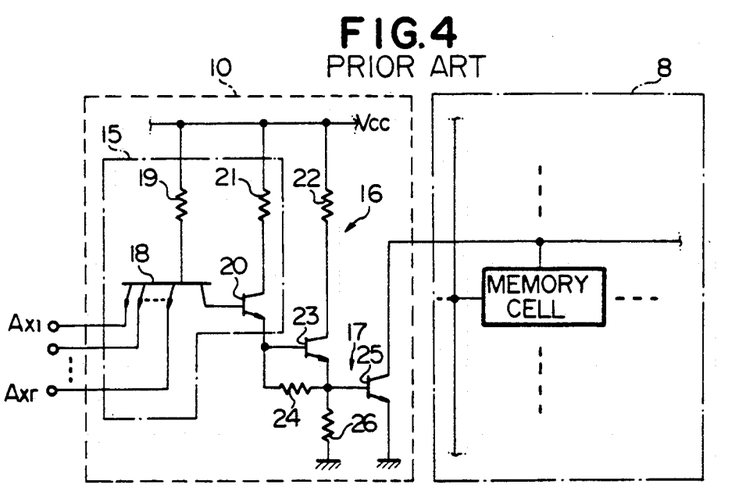
FIG. 4 is a circuit diagram showing the arrangement of a part of the row circuit provided for a row line.

FIG. 4 shows a part of the circuit arrangement of the row selector circuit 10 in detail, and the part of the row selector circuit 10 is provided in association with one of the row lines. The part of the row selector circuit 10 largely comprises a decoder stage 15, an amplifier stage 16 and an output stage 17. The decoder stage 15 has a multiple emitter n-p-n bipolar transistor 18 associated with a resistor 19 and an n-p-n bipolar transistor 20 also associated with a resistor 21, and the row address bits Ax1 to Axr are supplied to the emitter nodes of the n-p-n bipolar transistor 18, respectively. The base node of the n-p-n bipolar transistor 20 is coupled to the collector node of the multiple emitter bipolar transistor 18, so that the n-p-n bipolar transistor turns on to provide a current path when all of the row address bits are in the positive high voltage level.

The amplifier stage 16 is formed by a series combination of a resistor 22 and an n-p-n bipolar transistor 23 as well as a resistor 24 coupled between the base node and the emitter node of the n-p-n type bipolar transistor 23. The base node of the n-p-n bipolar transistor 23 is coupled to the emitter node of the n-p-n bipolar transistor 20, and, accordingly, is shifted between on and off states by the decoder stage 15. In other words, when all of the row address bits are in the positive high voltage level, the n-p-n bipolar transistor 23 turns on to supply the output stage 17 with a current.

The output stage 17 has an n-p-n bipolar transistor 25 and a resistor 26 coupled between the base node of the bipolar transistor 25 and the ground node, and the n-p-n bipolar transistor 25 is coupled between the row line and the ground node for selectively providing a current path. The n-p-n bipolar transistor 25 is large enough to allow the large amount of current in the write-in mode of operation to flow therethrough, and the resistors 19, 21 and 22 are selected to have respective resistances for supplying the bipolar transistor 25 with a sufficient base current. The resistors 24 and 26 aim at compensating leak currents.

In a read-out mode of operation, an address signal A1 to An is transferred from the address circuit 9 to the row selector circuit 10 and the column selector circuit 11, and a row line as well as a column line or column lines are selected to transfer a data bit in the form of current to the output buffer circuit 14. The amount of current is representative of logic level of the data bit read out from the selected memory cell, and the output buffer circuit 14 decides the logic level of the read out data bit depending upon the amount of current. The maximum amount of current in the read out mode of operation is about 1 milli-ampere.

If the chip enable signal CE1 to CEj is applied to the chip enable circuit 13, the output buffer circuit 14 is inactivated as described hereinbefore. The address signal A1 to An is supplied to the address circuit 9 together with the complementary bits thereof, and the row selector circuit 10 selects one row line from the plural row lines. The address circuit 9 further activates the write-in circuit 12 to select one column line from the plural column lines, and a large amount of current is supplied from the output pins O1 to Om through the write-in circuit 12 to the selected column line. The large amount of current breaks the junction of the memory cell located at the crossing point of the selected row and column lines, and flows into the selected row line. The row selector circuit provides the current path to the ground in the output stage 17, and, for this reason, the large amount of current is discharged to the ground. The amount of current in the write-in mode of operation is about 200 milli-ampere.

However, a problem is encountered in the prior art programmable read only memory device in that a long time period is consumed in the read out mode of operation. This is because of the fact that the n-p-n bipolar transistor 25 is excessively saturated with a large amount of the base current supplied from the amplifier stage 16. As described hereinbefore, since the amount of the current in the write-in mode of operation is about two hundreds times larger than the amount of current in the read out mode of operation, the amplifier stage 16 is provided in association with the output stage 17, however, the base current supplied from the amplifier stage 16 is too large to drive the n-p-n bipolar transistor in the read out mode of operation.

Moreover, there is another problem in the prior art programmable read only memory device in large current consumption due to the amplifier stage 16.

SUMMARY OF THE INVENTION

It is therefore an important object of the present invention to provide a programmable read only memory device from which a data bit is read out at a higher speed.

It is also an important object of the present invention to provide a programmable read only memory device which is decreased in the current consumption.

To accomplish these objects, the present invention proposes to provide dual row selector circuits one of which is inactivated in the read out mode of operation.

In accordance with the present invention, there is provided a programmable read only memory device having a read out mode of operation and a write in mode of operation, comprising: (a) a plurality of memory cells arranged in rows and columns and having respective element each capable of being permanently changed in resistance with a large amount of a write in current, each of the memory cells being operative to store a data bit of either logic "1" or "0" level depending upon the resistance of the element of the memory cell; (b) a plurality of row lines respectively coupled to the rows of the memory cells; (c) a plurality of column lines respectively coupled to the columns of the memory cells; (d) column selector means coupled to the column lines and responsive to a column address signal for supplying one or plurality of the column lines with the write in current in the write in mode of operation and with a small amount of a read out current in the read out mode of operation; (e) a row selector circuit having a plurality of row selector blocks respectively associated with the row lines, and responsive to a row address signal for selectively activating one of the row selector blocks, thereby providing a current path from one of the row lines to a first constant voltage source; and (f) an output circuit coupled to aforesaid one or a plurality of the column lines in the read out mode of operation to decide the voltage level or levels on the column line or lines for producing an output signal or signals representative of the data bit or bits stored in one or a plurality of the memory cells, in which each of the row selector block comprises a first discharging unit having a large current driving capability and activated in the write in mode of operation for providing a major part of the current path, and a second discharging unit having a small current driving capability and activated for providing a minor part of the current path in the write in mode of operation and for providing the current path in the read out mode of operation, and in which the programmable read only memory device further comprises a control unit responsive to an external signal and operative to establish the major part of the current path in the write in mode of operation and to block the major part in the read out mode of operation.

BRIEF DESCRIPTION OF THE DRAWINGS

The features and advantages of a programmable read only memory device according to the present invention will be more clearly understood from the following description taken in conjunction with the accompanying drawings in which.

DESCRIPTION OF THE PREFERRED EMBODIMENTS

First Embodiment

Figure 5:
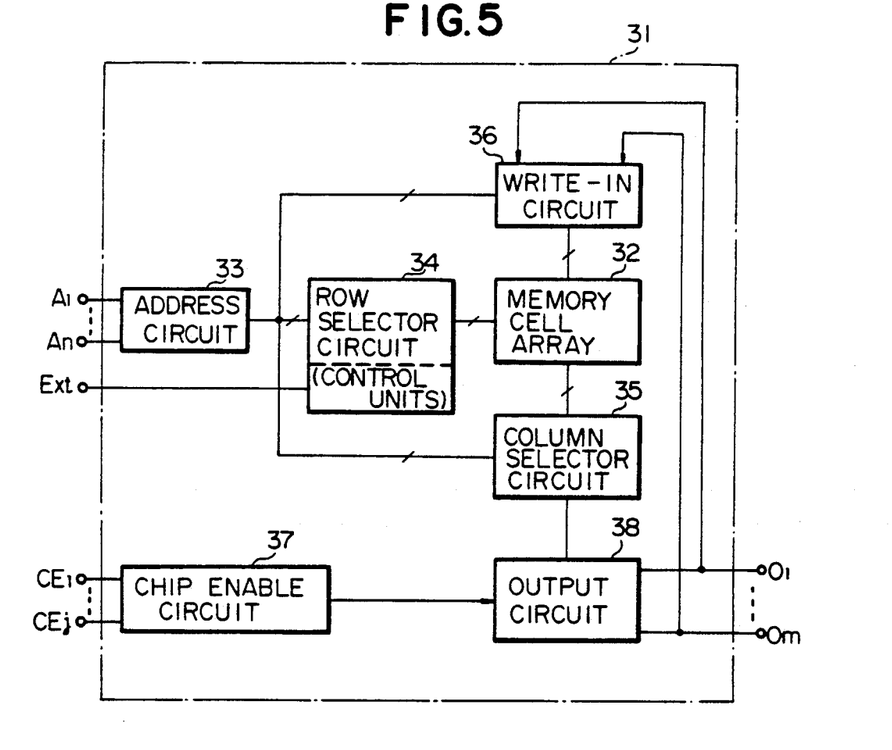
FIG. 5 is a block diagram showing the circuit arrangement of a programmable read only memory device embodying the present invention.
Figure 6:
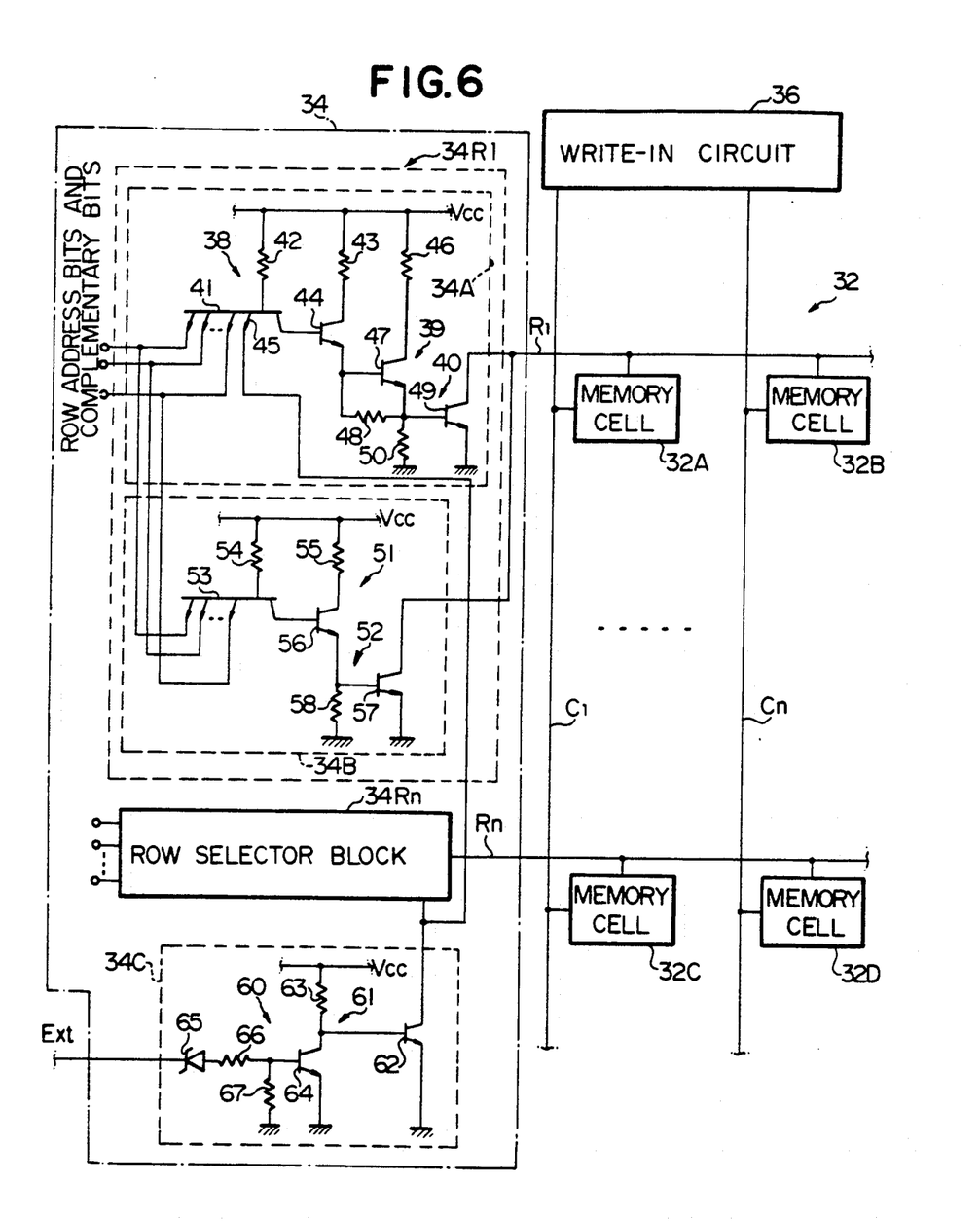
FIG. 6 is a circuit diagram showing the arrangement of an essential part of the programmable read only memory device shown in FIG. 5.

Referring first to FIG. 5 of the drawings, a programmable read only memory device according to the present invention is fabricated on a semiconductor chip 31, and comprises a memory cell array 32 having a plurality of programmable read only memory cells arranged in rows and columns. Although a large number of the programmable read only memory cells are incorporated in the array 32, only four memory cells 32A, 32B, 32C and 32D are shown in FIG. 6. The memory cells are of the type formed by a bipolar transistor arranged in similar to FIGS. 1A to 1C, however, these memory cells are replaceable with the memory cells of the type formed by a series combination of a fuse element and a diode as shown in FIG. 2A and 2B.

The programmable read only memory cells are associated with a plurality of row lines R1 to Rn and further with a plurality of column lines C1 to Cn, and each row line is coupled to each row of the memory cells. Each of the column lines is coupled to each column of the memory cells, and, accordingly, each programmable read only memory cell is specified by a combination of the row and column lines. Data bits read out from the accessed memory cells appear on the column lines, and each of the data bits is in the form of either high or low voltage level.

Turning back to FIG. 5, a multiple-bit address signal consisting of row and column address bits A1 to An is supplied to an address circuit 33, and the address circuit 33 distributes the address bits A1 to An and the complementary bits thereof to a row selector circuit 34 and a column selector circuit 35 in a read out mode of operation. However, the address circuit 33 supplies the row selector circuit 34 with the row address bits and the complementary bits thereof and a write-in circuit 36 with the column address bits and the complementary bits thereof for providing a current path from output pins O1 to Om to a selected column line in a write in mode of operation.

The programmable read only memory device shown in FIG. 5 further comprises a chip enable circuit 37 supplied with a multiple-bit chip enable signal CE1 to CEj, and the chip enable circuit 37 shifts an output circuit 38 between an activated state and an inactivated state. If the output circuit 38 is activated in the read out mode of operation with the chip enable signal, the output circuit 38 produces output signals representative of the data bits on the selected column lines, and the output signals are transferred from the output circuit 38 to the output pins O1 to Om. However, when the output circuit remains in the inactivated state in the write-in mode of operation, no output signal takes place.

Turning to FIG. 6 of the drawings, the row selector circuit 34 is illustrated in detail. The row selector circuit 34 is provided with a plurality of row selector blocks respectively associated with the row lines R1 to Rn, and each of the row selector blocks 34R1 to 34Rn has a first discharging unit 34A, and a second discharging unit 34B. A control unit 34C is provided in association with the row selector blocks 34R1 to 34Rn, and the control unit 34C is operative to change current driving capabilities of the row selector blocks 34R1 to 34Rn depending upon the operation mode. Every selector block is supplied with a combination of the row address bits and the complementary bits thereof different from the other selector blocks, and, for this reason, one of the selector blocks is activated to provide a current path from the associated row line to the ground node depending upon the bit string of the combination of the row address bits and the complementary bit or bits.

The first discharging unit 34A is provided with a decoder stage 38, a amplifier stage 39 and an output stage 40, and the decoder stage 38 has a multiple emitter n-p-n bipolar transistor 41, resistors 42 and 43 and an n-p-n type bipolar transistor 44. The resistor 42 is coupled between a source of positive voltage level Vcc and the base node of the multiple emitter bipolar transistor 41, and the emitter nodes are respectively supplied with the combination of the row address bits and the complementary bit or bits except for the emitter node 45. The collector node of the multiple emitter bipolar transistor 41 is coupled to the base node of the n-p-n bipolar transistor 44, and the n-p-n bipolar transistor 44 turns on to provide a current path from the source of positive voltage level Vcc to the amplifier stage 39 under the bit string consisting of logic "1" levels. The logic "1" level is represented by a positive high voltage level. Thus, the decoder stages 38 of all the row selector blocks serve as a decoder for the row address bits.

The amplifier stage 39 has a series combination of a resistor 46 and an n-p-n bipolar transistor 47, and a resistor 48 coupled between the base node and the emitter node of the bipolar transistor 47. The n-p-n bipolar transistor 47 thus coupled turns on under the on-state of the n-p-n bipolar transistor 44. The resistors 42, 43 and 46 are selected to have respective resistances for supplying a large amount of the base current, however, the resisters 48 and 50 are provided for restricting the leakage currents.

The output stage 40 has an n-p-n type bipolar transistor 49 and a resistor 50 coupled between the base node of the bipolar transistor 49 and the ground node, and the n-p-n type bipolar transistor provides a current path between the row line R1 and the ground node when the n-p-n bipolar transistor 44 and, accordingly, bipolar transistor 47 turn on to supply the base current thereto. The n-p-n bipolar transistor thus coupled to the row line R1 needs to mainly flow a large amount of current (which is hereinbelow referred to as "write in current") in the write in mode of operation, and, for this reason, the amplifier stage 39 is provided between the decoder stage 38 and the output stage 40 so as to supply a large amount of the base current to the output stage 40. The current path established in the n-p-n bipolar transistor 49 corresponds to a major part of the current path stated in claims defining the present invention.

The second discharging unit 34B is provided with a decoder stage 51 and an output stage 52. In this words, an amplifier stage is eliminated from the second discharging unit 34B, because the output stage 52 should be smaller in current driving capability than the output stage 40.

The decoder stage 51 has a multiple emitter n-p-n bipolar transistor 53, resistors 54 and 55 and an n-p-n type bipolar transistor 56. The resistor 54 is coupled between a source of positive voltage level Vcc and the base node of the multiple emitter bipolar transistor 53, and all of the emitter nodes are respectively supplied with the combination of the row address bits and the complementary bit or bits. The collector node of the multiple emitter bipolar transistor 53 is coupled to the base node of the n-p-n bipolar transistor 56, and the n-p-n bipolar transistor 56 turns on to provide a current path from the source of positive voltage level Vcc to the output stage 52 under the bit strings consisting of logic "1" levels. The resistors 54 and 55 are selected to have respective resistances for supplying the small amount of the base current.

The output stage 52 has an n-p-n type bipolar transistor 57 and a resistor 58 coupled between the base node of the bipolar transistor 57 and the ground node, and the n-p-n type bipolar transistor 57 also provides a current path between the row line R1 and the ground node when the n-p-n bipolar transistor 56 turns on to supply the base current thereto. The n-p-n bipolar transistor 57 thus coupled to the row line R1 shares the write in current with the n-p-n bipolar transistor 49, however, the amount of the write in current is merely small in comparison with the current passing through the n-p-n bipolar transistor 49. The n-p-n type bipolar transistor is expected to rather flow a current in the read out mode of operation (which is hereinbelow referred to as "read out current"), and, for this reason, any amplifier stage is not provided between the decoder stage 51 and the output stage 52. The proportion of the write in current to the read out current is 200:1, and, for this reason, the current driving capability between the n-p-n type bipolar transistors 49 and 57 may be selected to be 199:1. In order to decrease the current driving capability of the output stage 52, the resistors 54 and 55 are small in resistance, so that the decoder stage 51 merely consumes a small amount of current. The current path established in the n-p-n bipolar transistor 57 corresponds to a minor part of the current path stated in the claims.

The control unit 34C largely comprises a detector stage 60, an inverter stage 61 and an output stage 62. The inverter stage 61 comprises a series combination of a resistor 63 and an n-p-n bipolar transistor 64 coupled between the source of positive voltage level Vcc and the ground node, and the detector stage 60 comprises a series combination of a Zener diode 65 and a resistor 66 coupled between a control pin for an external control signal Ext and the base node of the n-p-n bipolar transistor 64, and a resistor 67 coupled between the base node and the ground node. Since the signals such as the address signal are swung between the positive high voltage level of, for example, about +5.5 volts and the low voltage level of, for example, about −0.5 volt, the external control signal Ext swings its voltage level across the high voltage level, and the break down voltage of the Zener diode 65 is adjusted to be higher than the high voltage level but within the swinging range of the external control signal Ext. In this instance, the external control signal Ext goes up to about 12 volts, and the break down voltage of the zener diode 65 is about +7.0 volts or higher level.

The output stage 62 is formed by an n-p-n bipolar transistor 62 coupled between the emitter node 45 of each first discharging unit and the ground node, and is gated by the inverter stage 61. The resistor 63 has a resistance large enough to restrict the amount of current passing through the bipolar transistor 64, so that the amount of the current is extremely small for causing the bipolar transistor 62 to turn off.

Description is hereinbelow made for the read out mode of operation and the write in mode of operation on the assumption that the memory cell 32A and the other memory cells coupled to the word line R1 are selected by the row address bit. In this instance, a plurality of data bits are simultaneously read out form the memory device, however, the description is focused upon the memory cell 32A only for the sake of simplicity.

In the read out mode of operation, the external control signal Ext remains below the break down voltage level of the zener diode 65, and the ground voltage level is supplied to the base node of the n-p-n bipolar transistor 64. With the ground voltage level at the base node, the n-p-n bipolar transistor 64 is turned off, and, accordingly, the positive voltage level Vcc is supplied to the base node of the bipolar transistor 62. This results in that the n-p-n bipolar transistor 62 turns on to ground the emitter node 45. When the emitter node 45 is grounded, the base node of the n-p-n bipolar transistors 44 and 47 and, accordingly, the bipolar transistor 49 remain in the off-states even if the bit string consists of logic "1" levels.

However, the decoder stage 51 supplies the high voltage level to the n-p-n bipolar transistor 57, and, for this reason, the small amount of the read out current flows from the column line C1 through the memory cell 32A and the n-p-n bipolar transistor 57 to the ground if the junction is not broken down. Thus, the column line C1 goes down toward the ground level, and the output circuit 38 produces an output signal corresponding to the voltage level on the column line C1. If, on the other hand, no junction is broken down, the column line C1 remains in the ground voltage level, so that the output circuit 38 produces the output signal of the opposite logic level.

Thus, the n-p-n bipolar transistor 49 does not activate in the read out mode of operation, and only the n-p-n type bipolar transistor 57 with a small current driving capability is used to discharge the read out current. For this reason, the programmable read only memory device is decreased in the current consumption. Moreover, since the output stage 52 is not associated with any amplifier stage 51, the n-p-n bipolar transistor 52 is not excessively saturated with the base current, and, accordingly, consumes a short time period for turning on. This results in increasing in the reading out speed of the data bit.

If the write in mode of operation is established in the programmable read only memory device with the external control signal of about 12 volts in the absence of the chip enable signal, the zener diode 65 passes the external control signal of about 12 volts, and the n-p-n bipolar transistor 64 turns on to ground the base node of the transistor 62. With the ground voltage level at the base node, the n-p-n bipolar transistor 62 turns off to cut off the current path from the emitter node 45 to the ground node. Then, the multiple emitter bipolar transistor 41 turns on with the bit string consisting of logic "1" levels. The decoder stage 38 supplies the amplifier stage 39 with the base current, and the amplifier stage 39 in turn supplies the base current to the n-p-n bipolar transistor 49 of the output stage 40. The n-p-n bipolar transistor 49 provides the major part of the current path from the row line R1 to the ground node. With the same bit string, the decoder stage 51 supplies the base current to the n-p-n bipolar transistor 57 of the output stage 52, so that the n-p-n bipolar transistor 57 remains in the on-state.

The write-in circuit 36 provides the current path from the output pins O1 to Om to the column line C1, and, for this reason, the junction of the memory cell 32A is broken down by the large amount of the write in current, however, the write in current is transferred to the row line R1. The write in current on the row line R1 is discharged through both of the n-p-n bipolar transistors 49 and 57 to the ground node. The n-p-n bipolar transistor 49 is large enough to mainly discharge the write in current, no problem takes place in the write in mode of operation.

Second Embodiment

Figure 7:
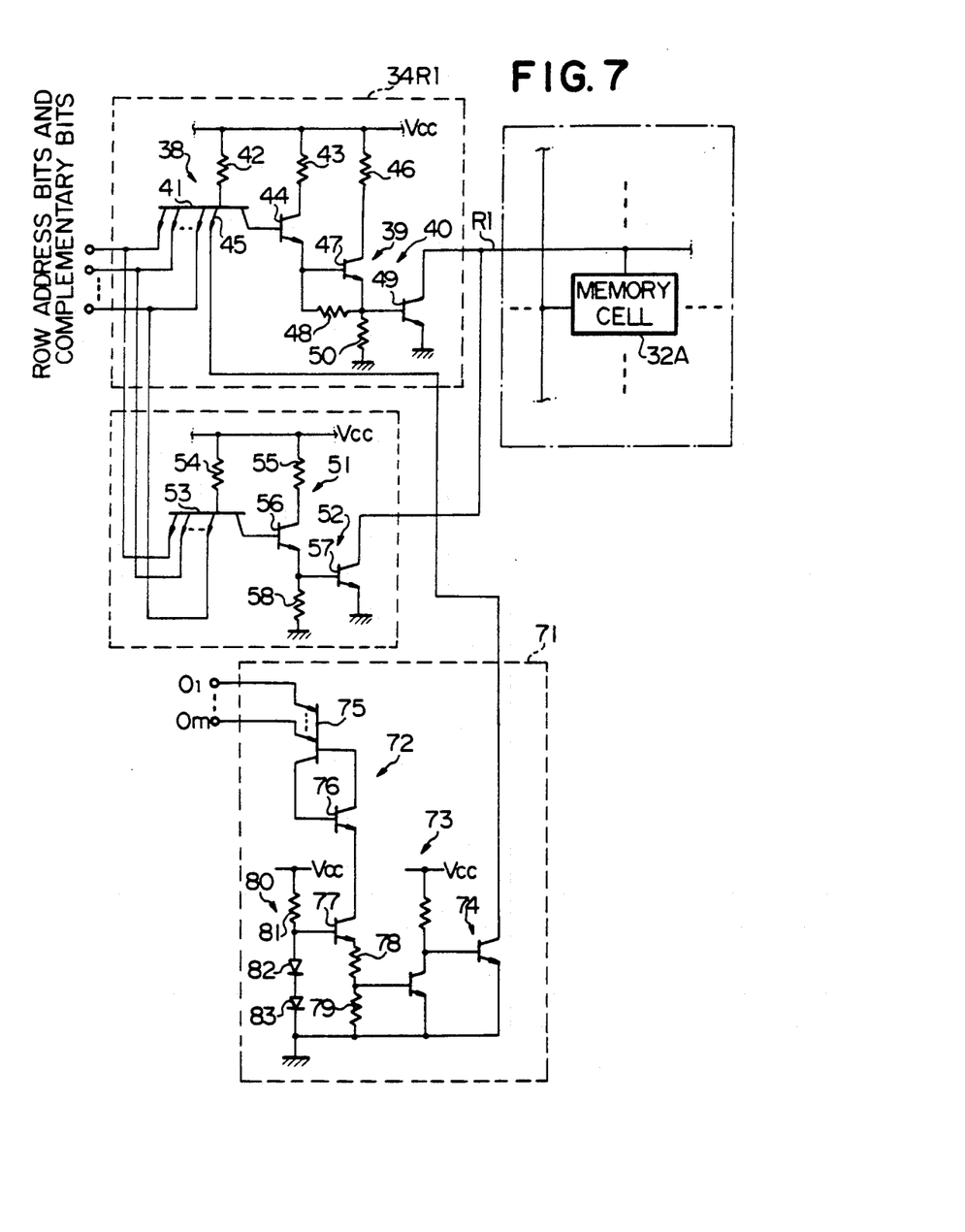
FIG. 7 is a circuit diagram showing the arrangement of an essential part of another programmable read only memory device embodying the present invention.

Turning to FIG. 7 of the drawings, an essential part of another programmable read only memory device is illustrated. The programmable read only memory device shown in FIG. 7 is similar to that shown in FIGS. 5 and 6 except for a control unit 71 of each row selector block, and, for this reason, other component units and elements are denoted by like reference numerals designating the corresponding units and elements in FIG. 6 without any detail description. Japanese Pat. application No. 58-130655 may be a related art of this instance.

The control unit 71 comprises a detector stage 72, an inverter stage 73, and an output stage 74. The inverter stage and the output stage are similar in circuit arrangement to those shown in FIG. 6, so that no further description is incorporated hereinbelow for these stages.

The detector stage 72 comprises a multiple emitter bipolar transistor 75 having a plurality of emitter nodes coupled to the output pins O1 to Om, a series combination of n-p-n bipolar transistors 76 and 77 and resistors 78 and 79 coupled between the base node of the bipolar transistor 75 and the ground node, and a voltage divider circuit 80 coupled between the source of positive voltage level Vcc and the ground node for applying an appropriate voltage level to the base node of the bipolar transistor 77. The voltage divider circuit 80 has a series combination of a resistor 81 and diodes 82 and 83, and the collector node of the bipolar transistor 75 is coupled to the base node of the bipolar transistor 76. The resistors 81, 78 and 79 are selected to have respective resistances in such a manner that the bipolar transistor 77 turns on if the bipolar transistor 76 supplies a current to the bipolar transistor 77 upon application of a part of the write in current thereto. Thus, the part of the write in current controls the unit 71, so that no external control signal Ext is required for the programmable read only memory device shown in FIG. 7.

Although particular embodiments of the present invention have been shown and described, it will be obvious to those skilled in the art that various changes and modifications may be made without departing from the spirit and scope of the present invention. For example, in the programmable read only memory device of the first embodiment, one of the memory cells is specified by the address signal for writing a data bit therein, and the data bits are simultaneously read out from the memory cells coupled to a selected word line. However, one of the memory cells may be accessed in both write-in and read-out modes of operation. In another implementation, a plurality of data bits are simultaneously written in the memory cells coupled to a selected row line.

What is claimed is:

1. A programmable read only memory device having a read out mode of operation and a write-in mode of operation, comprising:
   (a) a plurality of memory cells arranged in rows and columns and having respective elements each capable of being permanently changed in resistance with a large amount of a write-in current, each of said memory cells being operative to store a data bit of either logic "1" or "0" level depending upon the resistance of the element of the memory cell;
   (b) a plurality of row lines respectively coupled to the rows of said memory cells;
   (c) a plurality of column lines respectively coupled to the columns of said memory cells;
   (d) column selector means coupled to said column lines and responsive to a column address signal for supplying one or a plurality of said column lines with said write-in current in said write-in mode of operation and with a small amount of a read out current with respect to said write-in current in said read out mode of operation;
   (e) a row selector circuit having a plurality of row selector blocks respectively associated with said row lines, and responsive to a row address signal for selectively activating one of the row selector blocks, thereby providing a current path from one of said row lines to a first constant voltage source; and
   (f) an output circuit coupled to the aforesaid one or a plurality of said column lines in said read out mode of operation to change the voltage level or levels on the column line or lines for producing an output signal or signals representative of the data bit or bits stored in one or a plurality of the memory cells, in which each of said row selector blocks comprises a first discharging unit having a large current driving capability and activated in said write-in mode of operation for providing most of said current path, and a second discharging unit having a small current driving capability with respect to said first discharging unit and activated for providing the remaining part of said current path in said write-in mode of operation and for providing the current path in said read out mode of operation, and in which said programmable read only memory device further comprises a control unit responsive to an external signal and operative to establish most of said current path in said write-in mode of operation and to block most of said current path in said read out mode of operation.

2. A programmable read only memory device as set forth in claim 1, in which said first discharging unit comprises a first decoder stage responsive to said row address signal, a first output stage coupled between said associated one of said row lines and said first constant voltage source, and a first amplifier stage coupled between the first decoder stage and the first output stage for controlling the first output stage.

3. A programmable read only memory device as set forth in claim 2, in which said second discharging unit comprises a second decoder stage responsive to said row address signal, and a second output stage coupled between said associated one of said row lines and said first constant voltage source and controlled by the second decoder stage, and in which said second output stage is smaller in current driving capability than said first output stage.

4. A programmable read only memory device as set forth in claim 3, in which said control unit comprises a detector stage supplied with said external signal, an inverter stage coupled to the inverter stage, and a third output stage coupled between said first decoder stage and said first constant voltage source and operative to forcibly shift said first decoder circuit into an inactive state in the presence of the external signal detected by the detector stage.

5. A programmable read only memory device as set forth in claim 4, in which said first decoder stage comprises a first multiple emitter bipolar transistor having a plurality of emitter nodes supplied with a part of the row address signal and a complementary bit or bits of the other part of the row address signal except for one of the emitter nodes coupled to said third output stage, a first resistor coupled between a second constant voltage source and the base node of the first multiple emitter bipolar transistor, and a series combination of a second resistor and a second bipolar transistor coupled between the second constant voltage source and the output node thereof and having a base node coupled to the collector node of the first multiple emitter bipolar transistor.

6. A programmable read only memory device as set forth in claim 5, in which said first output stage comprises a third bipolar transistor coupled between said associated row line and said first constant voltage source, and a third resistor coupled between the base node of the third bipolar transistor and the first constant voltage source.

7. A programmable read only memory device as set forth in claim 6, in which said first amplifier stage comprises a series combination of a fourth resistor and a fourth bipolar transistor coupled between second constant voltage source and the base node of said third bipolar transistor and having a base node coupled to the output node of said first decoder stage, and a fifth resistor coupled between the base node and the emitter node of the fourth bipolar transistor.

8. A programmable read only memory device as set forth in claim 7, in which said second decoder stage comprises a fifth multiple emitter bipolar transistor having a plurality of emitter nodes supplied with the part of row address signal and the complementary bit or bits of the other part of the row address signal, a sixth resistor coupled between said second constant voltage source and the base node of the fifth multiple emitter bipolar transistor, and a series combination of seventh resistor and a sixth bipolar transistor coupled between the second constant voltage source and the output node thereof and having a base node coupled to the collector node of the fifth multiple emitter bipolar transistor.

9. A programmable read only memory device as set forth in claim 8, in which said second output stage comprises a seventh bipolar transistor coupled between said associated row line and said first constant voltage source, and a eighth resistor coupled between the base node of the seventh bipolar transistor and the first constant voltage source.

10. A programmable read only memory device as set forth in claim 9, in which said detector stage comprises a series combination of a zener diode and an ninth resistor supplied with said external signal, and a tenth resistor coupled between the ninth resistor and the first constant voltage source.

11. A programmable read only memory device as set forth in claim 10, in which said external signal is formed by a part of said write-in current.

12. A programmable read only memory device as set forth in claim 10, in which said inverter stage comprises a series combination of a eleventh resistor and an eighth bipolar transistor coupled between said first and second constant voltage sources and having a base node coupled to said ninth resistor.

13. A programmable read only memory device as set forth in claim 12, in which said third output stage is formed by a ninth bipolar transistor coupled between aforesaid one of the emitter nodes of said first multiple emitter bipolar transistor and said first constant voltage source.

14. A programmable read only memory device as set forth in claim 13, in which said detector stage comprises a tenth multiple emitter bipolar transistor having a plurality of emitter nodes supplied with the part of said write-in current, a series combination nation of twelfth and thirteenth bipolar transistors and twelfth and thirteenth resistors coupled between the base node of the tenth multiple emitter bipolar transistor and the first constant voltage source, and a voltage divider circuit coupled between the first and second constant voltage sources for applying an appropriate voltage level to the base node of the twelfth bipolar transistor, and in which the collector node of said tenth multiple emitter bipolar transistor is coupled to the base node of said eleventh bipolar transistor.

15. A programmable read only memory device as set forth in claim 14, in which said voltage divider circuit is formed by a series combination of a fourteenth resistor and a plurality of diodes.

16. A programmable read only memory device having a read out mode of operation and a write-in mode of operation, comprising:
 (a) a plurality of memory cells arranged in rows and columns and having respective diodes each capable of being permanently broken down with a large amount of a write-in current with respect to a read out current, each of said memory cells being operative to store a data bit of either logic "1" or "0" level depending upon whether or not the diode of the memory cell is broken;
 (b) a plurality of row lines respectively coupled to the rows of said memory cells;
 (c) a plurality of column lines respectively coupled to the columns of said memory cells;
 (d) column selector means coupled to said column lines and responsive to a column address signal for supplying one of said column lines with said write-in current in said write-in mode of operation and for supplying a predetermined number of said column lines with said read out current in said read out mode of operation;
 (e) a row selector circuit having a plurality of row selector blocks respectively associated with said row lines, and responsive to a row address signal for selectively activating one of the row selector blocks, thereby providing a current path from one of said row lines to a first constant voltage source; and
 (f) an output circuit coupled to the aforesaid predetermined number of said column lines in said read out mode of operation to change the voltage levels on the respective predetermined number of the column lines for producing output signals representative of the data bits respectively stored in the memory cells, in which each of said row selector blocks comprises a first discharging unit having a large current driving capability and activated in said write-in mode of operation for providing most of said current path, and a second discharging unit having a small current driving capability with respect to said first discharging unit and activated for providing the remaining part of said current path in said write-in mode of operation and for providing the current path in said read out mode of operation, and in which said programmable read only memory device further comprises a control unit responsive to an external signal and operative to establish most of the current path in said write-in mode of operation and to block most of the current path in said read out mode of operation.

* * * * *